United States Patent [19]

Claydon et al.

[11] Patent Number: 5,245,297
[45] Date of Patent: Sep. 14, 1993

[54] POWER AMPLIFIER AND TRANSMITTER WITH IMPROVED RAMPING

[75] Inventors: Martin Claydon; Jonathan C. Griffiths, both of Cambridge, England

[73] Assignee: U.S. Philips Corporation, New York, N.Y.

[21] Appl. No.: 844,272

[22] Filed: Mar. 2, 1992

[30] Foreign Application Priority Data

Mar. 11, 1991 [GB] United Kingdom ............... 9105064

[51] Int. Cl.$^5$ .............................................. H03G 3/20
[52] U.S. Cl. ..................................... 330/129; 330/85; 455/115
[58] Field of Search ................. 330/85, 129, 131, 279; 455/115, 126

[56] References Cited

U.S. PATENT DOCUMENTS 4,392,245  7/1983  Mitama ............................... 455/115
5,101,175  3/1992  Vaisanen ......................... 330/131 X Primary Examiner—Steven Mottola
Attorney, Agent, or Firm—David R. Treacy

[57] ABSTRACT

A power amplifier suitable for use in TDD and TDMA systems in which burst transmissions have to conform to a time mask, comprises a power amplifier (10) having a signal input (11), a signal output (14) and a control voltage input (24). A r.f.feedback control loop is coupled between the signal output (14) and the control voltage input (24). The control loop includes detection means (18) coupled to a comparison means (22) in which the detected signal is compared with reference pulses produced by a generating means (28). The output of the comparison means is coupled to the control voltage input (24). In order to provide a control signal when the output power level is too low to be detected, an artificial detector (38) is connected between the output of the comparison means (22) and its input for the detected signal in order to feed back the control voltage. As a result the control voltage versus power output characteristic is extended which leads to the generation of less transient sidebands and interference.

13 Claims, 3 Drawing Sheets

POWER AMPLIFIER AND TRANSMITTER WITH IMPROVED RAMPING

BACKGROUND OF THE INVENTION

The present invention relates to a power amplifier and to a transmitting or transceiving apparatus including such a power amplifier. More particularly the present invention is concerned with the control of the power output of the amplifier so that for example it can be increased and decreased at a predetermined rate between a minimum level and a required level which is determined to suit a desired transmission range.

The ability to control the output power of a power amplifier in this way is of importance in many control and telecommunications applications. In digital telecommunication system which operate in accordance with a TDD (time division duplex) format, such as CT2, or in accordance with a TDMA (time division multiple access) format, such as GSM (Group Special Mobile) and DECT (Digital European Cordless Telephone) systems, the rate of ramping up to a required level and ramping down is specified in order to reduce the generation of transient sidebands and interference on adjacent channels which may occur with hard switching of the power amplifier.

For convenience of description, the present invention will be described with reference to a power amplifier for use in the GSM (Group Special Mobile) digital cellular telephone system. However the arrangement may be used in other applications requiring the transmission of pulses of r.f. digitised signals. The GSM system is a TDMA one having a signalling format which includes a framed structure commmprising eight slots each having a duration of approximately $570\mu S$. Transmission are made in one slot and reception is in a predetermined one of the remaining seven slots. An 8:1 time compression is used which results in a peak to average transmit power level of 8:1. A feature of the GSM specification is that the power amplifying arrangement must be capable of adaptive power control in that the transmitted power is adjusted in steps to suit the required transmission range. The size of the steps is 2 dB and there are 16 steps ranging from a maximum peak power of 43 dBm to a minimum peak power of 13 dBm. Another factor which has to be taken into account, particularly because the GSM system is a TDMA one, is the frequency spectrum specification which is achieved by shaping of the leading and trailing edges to reduce the risk of generating sidebands and interference on adjacent channels. The shaping of these edges may vary from one power step to the next but it is particularly important to apply shaping to the higher powered signals because the power has to be ramped to the required level in a maximum of 28 $\mu S$. A typical shaping profile is known as raised cosine. In order to achieve such a profile a control voltage is applied to the power amplifier, which may comprise a module formed by several successive amplifying stages, to control the power during the ramp and the burst. British Patent Specification 2 220 808 A discloses one method of deriving such a control voltage which makes use of a microcontroller to supply a succession of digital values to a digital to analogue converter (DAC) which in turn produces a train of pulses of predetermined amplitudes.

Power amplifiers can be controlled by either a completely open loop system or using negative feedback. In an open loop system a ramping pulse generator is coupled to a control input of the power amplifier. The relationship between the output power and the control voltage is determined by making measurements of a sample batch of power amplifiers and setting the control voltage to give the required output power with suitable ramps.

In a closed loop system a feedback voltage related to the output power is used to control the output power. Such closed loop systems are known per se from British Patent Specification 2 220 808 A.

A simplified block schematic diagram of a transceiver including a power amplifier having a closed loop control system is shown in FIG. 1 of the accompanying drawings. A power amplifier 10 has a signal input 11 for a signal from a modulator 12 and an output 14 for an amplified signal to be supplied to an antenna 15 by way of a duplexer 17. A portion of the amplified signal is coupled out using a quarter wave coupler 16 and is supplied to a detector system 18. An output of the system 18 is supplied by way of a resistor 20 to the inverting input of a comparator 22 whose output is connected to a control input 24 of the power amplifier 10. A capacitor 26 is coupled between the output of the comparator 22 and its inverting input. The capacitor 26 and the resistor 20 form a filter. A reference signal is applied to a non-inverting input of the comparator 22. The reference signal, which is indicative of the raised cosine ramps and the required power burst, is derived from a reference signal block 28 which is constituted by a microcontroller 30 which feeds a succession of predetermined digital values to a DAC 32 which in turn produces a succession of pulses which undergo shaping in a pulse shaper 34 before being applied to the non-inverting input of the comparator 22. A receiver 19 is coupled to the antenna 15 by way of the duplexer 17.

A drawback of this type of closed loop system is that the detector sensitivity is such that no appreciable output is obtained from the detector system 18 below approximately 0 dBm. However the GSM specification 05.05 states that the power at the start and end of a burst must be $-36dBm$ and that the move to the final required power level must be completed in a maximum time of 28 $\mu S$. FIG. 2 illustrates the ideal raised cosine ramp which will not generate undue interference. In reality though a control loop responding at this speed cannot be made to track with the input control voltage on the control input 24 due to the lack of output from the detector system 18 at low power levels. The effect of this lack of control is that there is a rapid initial increase in output power from the power amplifier 10, which initial increase produces an r.f. spectrum outside the GSM specification. This r.f. envelope is illustrated in FIG. 3.

SUMMARY OF THE INVENTION

An object of the present invention is to provide better tracking of the control loop at low power levels.

According to one aspect of the present invention there is provided a power amplifier arrangement comprising a power amplifier having a signal input, a signal output and an input for a control voltage, a r.f. feedback control loop coupled between the signal output and the control voltage input of the power amplifier, the feedback control loop including detection means and comparison means for providing the control voltage in response to comparing an input signal with a reference signal, and means for feeding back a portion of the control voltage to an input of the comparison means, whereby at output power levels below that which are detectable by the detection means, the power amplifier is not subject to r.f. feedback control which changes to predominantly r.f. feedback control at output power levels which are detectable by the detection means, and vice versa.

The present invention also provides a power amplifier arrangement comprising a power amplifier having a signal input, a signal output and an input for a control voltage, and a r.f. feedback control loop comprising means for deriving a signal indicative of the power amplifier output, detection means for detecting the signal derived by said means, comparison means having a first input coupled to an output of the detection means, a second input for connection to a reference signal producing means and an output coupled to the control voltage input of the power amplifier, and ramp-altering means having an input coupled to the output of the comparison means and an output coupled to the first input of the comparison means for feeding back a portion of the control voltage supplied in use to the control voltage input of the power amplifier.

By providing the ramp-altering means, a supplementary control loop is provided so that at low power levels, say less than 0 dBm, when the detection means is effectively inoperative, a portion of the control voltage applied to the control voltage input of the power amplifier is compared with the reference signal with the result that the loop is under immediate control and can be made to track the control voltage as it ramps-up and -down the output power. Hence the power amplifier generates less transient sidebands and interference.

If desired the ramp-altering means may comprise amplifying means, such as an operational amplifier having a similar gain/bandwidth characteristic as the comparison means. A non-inverting input of the operational amplifier is coupled to the signal path between the output of the comparison means and the input of the power amplifier for the control voltage and the output of the operational amplifier is coupled to the comparison means. Optionally a potential divider may be connected to the output of the operational amplifier and a tap of the potential divider is coupled to the comparison means.

In an alternative arrangement the ramp-altering means may comprise a potential divider coupled to the output of the comparison means for feeding back a predetermined portion of the control voltage to the comparison means.

According to a second aspect of the present invention there is provided a transmitting (or transceiving) apparatus including a power amplifier arrangement in accordance with the first aspect of the present invention.

The present invention will be described, by way of example, with reference to FIGS. 4 and 5 of the accompanying drawings.

BRIEF DESCRIPTION OF THE DRAWING

In the drawings the same reference numerals have been used to indicate the same features.

DESCRIPTION OF THE PREFERRED EMBODIMENT

Figure 4:
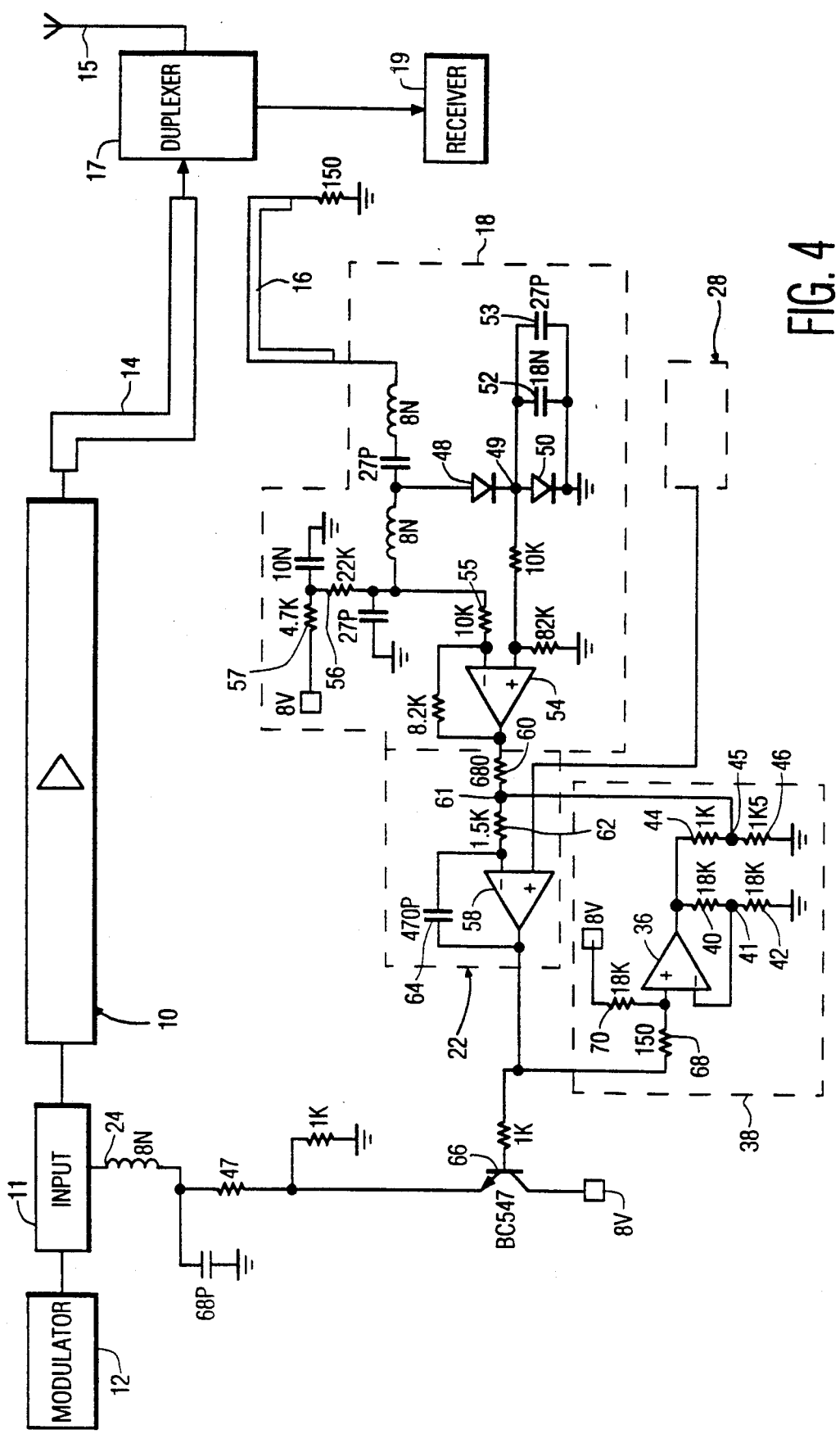
FIG. 4 is a circuit diagram, partly in block form, of a practical embodiment of the present invention.

Referring to FIG. 4, the components have the values indicated and the power amplifier 10 comprises a commercially available 12 V power amplifier such as a Motorola XHW912 12 W GSM Power Module.

The coupler 16 supplies r.f. feedback to the detector system 18 which comprises two series connected diodes 48,50 of type HMS 2822. The diode 50 provides temperature compensation once the r.f. power is sufficiently high for the system to operate closed loop. Once this point is reached the closed loop will itself compensate for changes in supply voltage and r.f. drive level. The diode 50 is shunted by a capacitance formed by parallel connected capacitors 52,53 of 10 nF and 27 pF, respectively. A junction 49 of the diodes 48,50 is connected by way of resistive potential divider to a non-inverting input of an operational amplifier (op-amp) 54 type NE 5532. The inverting input of the op-amp 54 is connected by way of a resistive potential divider formed by resistors 55,56,57 to an 8 volt supply line. A junction of the resistors 55,56 is coupled by way of an r.f. tuned circuit to the anode of the diode 48 in order to forward bias the diodes 48,50. The customary feedback resistor is connected between the output and inverting input of the op-amp 54.

The comparator 22 is based on an op-amp 58 type NE 5532 which has a first order loop filter formed around it. The filter is an RC filter formed by series connected resistors 60,62 of 680Ω and 1.5 kΩ, respectively, coupling the output of the op-amp 54 to the inverting input of op-amp 58 and a 470 pF capacitor 64 connected between the output and inverting input of the op-amp 58. The pulse-like reference signal produced by the reference signal block 28 is supplied to the non-inverting input of the op-amp 58 of type NE 5532. The NE 5532 op-amp has a 10 MHz unity gain bandwidth which gives the required stability over the operational bandwidth of the loop. The loop cut-off frequency for the values indicated is of the order of 600 kHz. The output of the op-amp 58 is connected to the base electrode of a transistor 66 type BC 547 operating as an emitter follower, the emitter of which is coupled to the input to the power amplifier 10 by way of an LC filter for preventing r.f. leakage into the output of the control loop.

The illustrated circuit further comprises an artificial detector 38 which includes an amplifier 36 constituted by an op-amp type TL082, the non-inverting input of which is coupled to the control voltage path, that is the output of op-amp 58, by way of a series 150Ω resistor 68, another resistor 70 is coupled between the non-inverting input and the 8 volt supply line. A parallel potential divider arrangement, comprising series connected, gain defining, 10KΩ resistors 40,42 and series connected 1KΩ, 1.5KΩ resistors 44,46, has one end connected to the output of the amplifier 36 and the other end connected to a reference voltage source such as ground. A common junction 41 of the resistors 40,42 is connected to the inverting input of the amplifier 36. A common junction 45 of the resistors 44,46 is connected to the inverting input of the amplifier 58 by way of a junction 61 of the resistors 60,62. The op-amp 36 has a similar gain/bandwidth characteristic as the comparator 22.

Figure 1:
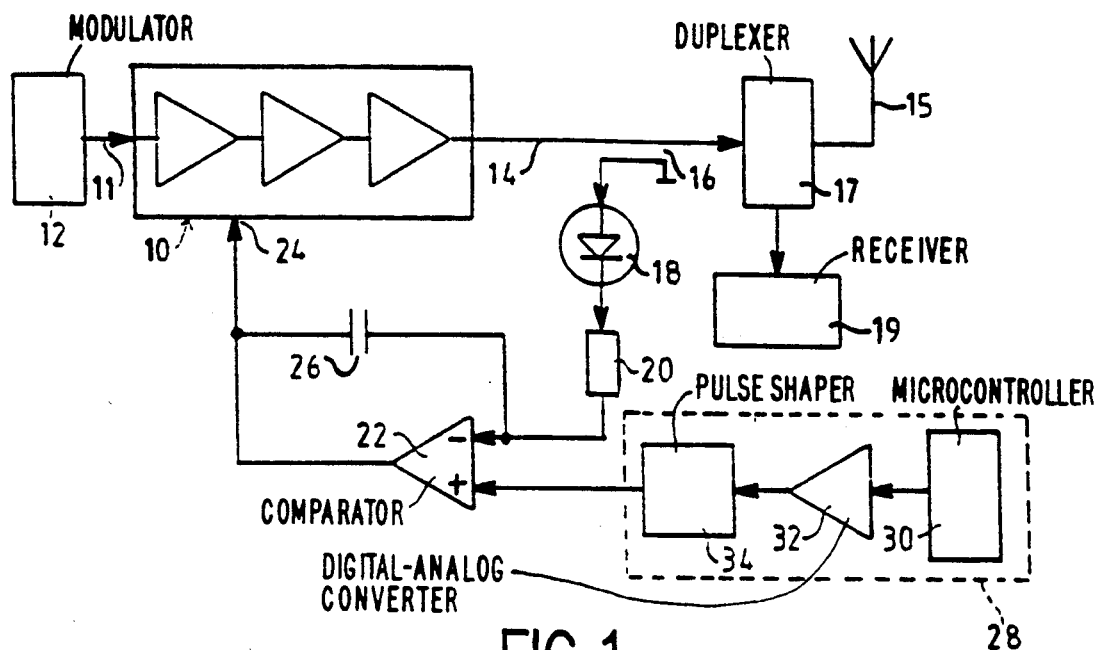
FIG. 1 is a block schematic diagram of a power amplifier having a known type of closed loop control system, FIGS. 2 and 3 respectively show the ideal raised cosine ramp and the r.f. envelope produced when using a closed loop control system which is unable to detect low power levels.
Figure 2:
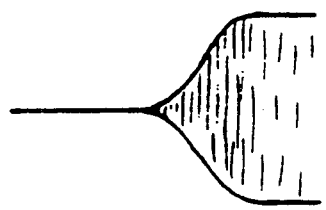
Figure 3:
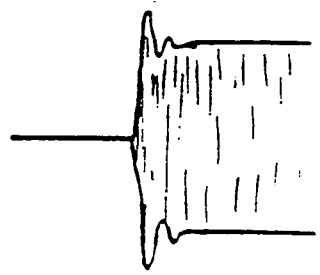

The basic operation of the power amplifier and the feedback (or closed) control loop is substantially the same as has been described with reference to FIG. 1 and in the interests of brevity it will not be repeated.

Figure 5:
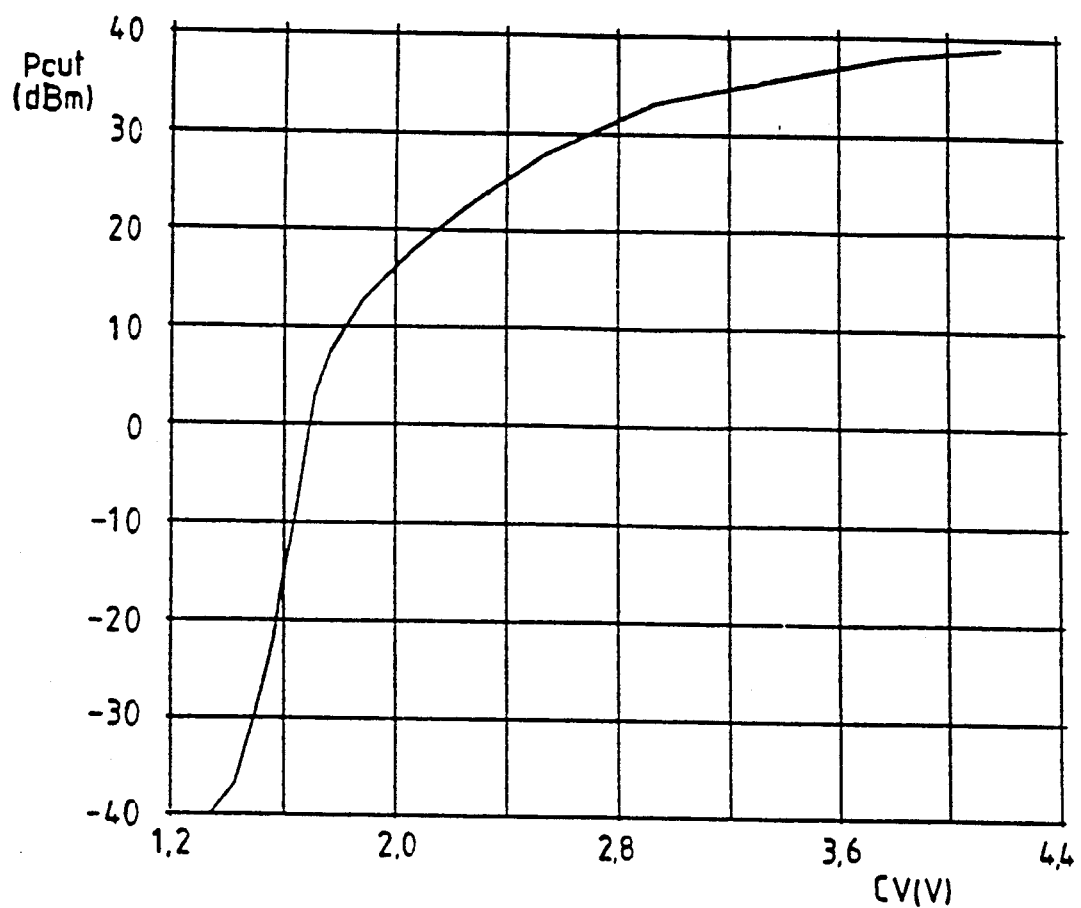
FIG. 5 is a graph of control voltage (CV) in volts versus output power (Pout) in dBm for the power amplifier shown in FIG. 4; this graph also represents the relationship between the reference pulses and power out, Pout.

However when the power output is below a level which is detectable by the detector system 18, there is no r.f. feedback to the comparator 22 so that the control loop is effectively open. However the artificial detector 38 forms a supplementary control loop which feeds back a portion of the control voltage to the comparator 22. The practical effect of this is that the r.f. feedback loop has an artificially extended range which is shown in FIG. 5. This supplementary control loop effectively reduces the gain of the circuit when the r.f. detector system 18 is inoperative. At higher power levels when the detector system 18 is operative, its output is summed with the control voltage fed back by way of the supplementary control loop. At output powers greater than 10 to 15 dBm, the detected power output becomes dominant factor in determining the output power.

The illustrated circuit enables the slope of a reference pulse/power output curve (FIG. 5) to be reduced sufficiently to allow setting of any power from −40 to 40 dBm. Below 0 dBm the power output depends on the control voltage −CV/Pout characteristic (FIG. 5) which can vary with operating conditions. This effectively makes the system open loop. Above 0 dBm the r.f. detector also operates, but is unable to completely control power for all conditions until the power is over 15 dBm. This makes the operation of the system a compromise between open and closed loop systems. The negative feedback is a compromise between minimum gradient of vin/Pout at low power and minimal effect at high power.

When calibrating the circuit shown in FIG. 5, temperature was found to have the most effect on the ramping shape and the peak power at lower power levels where the system is not closed loop. This effect is, however, linear with temperature. In practice it was found that it was possible to set the system up at room temperature to a power level of 13 dBm. This was done by adjusting the reference pulses to the correct shape to produce the required ramping shape. The gradient of the vin/Pout curve up to 13 dBm is nearly constant, and decreases for higher powers. This means that it is possible to simply multiply the whole ramping pulse by a calibration factor, at temperature extremes. Such a measure will correct the shape of the ramp up to 15 dBm but will not have sufficient effect on the higher powers to prevent the GSM specification from being met. The ramping pulse is derived from the DAC 32 (FIG. 1) and the calibration factor can be created by adjusting the reference on the DAC 32. In test the 13 dBm power level was selected, and the reference was adjusted to give the correct power. The system will now give the correct power at all levels, with the correct ramp shape. The control system will sense the temperature and adjust the reference as the temperature varies.

Further temperature compensation is provided by the detector system because the effect of temperature variations on the r.f. detector diode 48 (FIG. 4) will itself affect the circuit performance as the detected feedback signal will be incorrect. The provision of the diode 50 provides the necessary compensation for such variations on the conductivity of the diode 48. The diodes 48,50 are provided in the same physical package and both are forward biased so that the voltage drop across each of the diodes 48,49 is constant, thus the bias at the junction 49 is constant. As a result both inputs to the op-amp 54 track each other so that the net effect on the amplifier's output is zero.

In a non-illustrated embodiment of the present invention, the artificial detector 38 comprises a potential divider connected to the output of the comparator 22. A tap of the potentiometer is coupled to the inverting input of the comparator 22, that is, the inverting input of the op-amp 58.

Although the present invention has been described with reference to a power amplifier for use in GSM it is to be understood that it is equally applicable to power amplifiers for use in other applications where a time mask for a power envelope has been specified.

From reading the present disclosure, other modifications will be apparent to persons skilled in the art. Such modifications may involve other features which are already known in the design, manufacture and use of cellular and cordless telephone systems and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A power amplifier arrangement comprising:
   a power amplifier having a signal input, a signal output and a control voltage input, and
   a feedback control loop coupled between said signal output and said control voltage input, said loop including detection means providing a power level voltage representative of the signal output power level at levels greater than a given level, means for receiving a reference signal, and comparison means having a reference input and a power level input for comparing said power level voltage with said reference signal to provide said control voltage,
   characterized in that said arrangement further comprises ramp-altering means for feeding back a predetermined portion of the control voltage to said power level input of the comparison means, arranged such that the feedback loop is controlled predominantly by comparison of the reference signal with the power level voltage at levels greater than said given level, and by comparison of the reference signal with said portion at levels less than said given level.

2. An arrangement as claimed in claim 1, characterized in that said ramp-altering means comprises a potential divider coupled to the output of the comparison means.

3. An arrangement as claimed in claim 1, characterized in that said detection means comprises series-connected first and second diodes having a junction therebetween; means for coupling a signal representative of said signal output to said first diode; means for forward biasing said first and second diodes so that the voltage drop across each of said diodes remains substantially equal irrespective of the ambient temperature; an operational amplifier including means for setting the gain, and having an input connected to said junction, and an output; and means for coupling said output of the operational amplifier to said power level input of the comparison means.

4. An arrangement as claimed in claim 3, characterized in that said first and second diodes are in the same physical package.

5. A power amplifier arrangement comprising:
a power amplifier having a signal input, a signal output and a control voltage input, and
a feedback control loop coupled between said signal output and said control voltage input, said loop including detection means providing a power level voltage representative of the signal output power level at levels greater than a given level, means for receiving a reference signal, and comparison means having a reference input and a power level input for comparing said power level voltage with said reference signal to provide said control voltage,
characterized in that said arrangement further comprises ramp-altering means including amplifying means for feeding back a predetermined portion of the control voltage to said power level input of the comparison means, arranged such that the feedback loop is controlled predominantly by comparison of the reference signal with the power level voltage at levels greater than said given level, and by comparison of the reference signal with said portion at levels less than said given level.

6. An arrangement as claimed in claim 5, characterized in that said amplifying means comprises an operational amplifier having a gain/bandwidth characteristic similar to that of said comparison means,
said operational amplifier has a first input coupled to a signal path between the output of the comparison means and said control voltage input, and an output coupled to one of said inputs of said comparison means.

7. An arrangement as claimed in claim 6, characterised in that a potential divider is connected to the output of the operational amplifier and a tap of the potential divider is coupled to the comparison means.

8. A power amplifier arrangement comprising:
a power amplifier having a signal input, a signal output and a control voltage input, and
a feedback control loop coupled between said signal output and said control voltage input, said loop including detection means providing a power level voltage representative of the signal output power level at levels greater than a given level, means for receiving a reference signal, and comparison means having a reference input and a power level input for comparing said power level voltage with said reference signal to provide said control voltage,
characterized in that said detection means comprises series-connected first and second diodes having a junction therebetween; means for coupling a signal representative of said signal output to said first diode; means for forward biasing said first and second diodes so that the voltage drop across each of said diodes remains substantially equal irrespective of the ambient temperature; an operational amplifier including means for setting the gain, and having an input connected to said junction, and an output; and means for coupling said output of the operational amplifier to said power level input of the comparison means, and
said arrangement further comprises ramp-altering means for feeding back a predetermined portion of the control voltage to said power level input of the comparison means.

9. An arrangement as claimed in claim 8, characterized in that said ramp-altering means comprises a second operational amplifier having a gain/bandwidth characteristic similar to that of said comparison means, and
said second operational amplifier has a first input coupled to a signal path between the output of the comparison means and said control voltage input, and an output coupled to one of said inputs of said comparison means.

10. An r.f. transmitting apparatus including a power amplifier having a signal input, an r.f. output and a control voltage input, and
an r.f. feedback control loop coupled between said r.f. output and said control voltage input, said loop including detection means providing a power level voltage representative of the r.f. output power level at levels greater than a given level, means for receiving a reference signal, and comparison means having a reference input and a power level input for comparing said power level voltage with said reference signal to provide said control voltage,
characterized in that said arrangement further comprises ramp-altering means for feeding back a predetermined portion of the control voltage to said power level input of the comparison means, arranged such that the feedback loop is predominantly r.f. feedback control at r.f. output levels greater than said given level, and the feedback loop is controlled predominantly by comparison of the reference signal with said portion at r.f. output levels less than said given level.

11. An apparatus as claimed in claim 10, characterized in that said detection means comprises series-connected first and second diodes having a junction therebetween; means including an r.f. coupler for coupling a signal representative of said signal output to said first diode; means for forward biasing said first and second diodes so that the voltage drop across each of said diodes remains substantially equal irrespective of the ambient temperature; an operational amplifier including means for setting the gain, and having an input connected to said junction, and an output; and means for coupling said output of the operational amplifier to said power level input of the comparison means.

12. An apparatus as claimed in claim 11, characterized in that said first and second diodes are in the same physical package.

13. An apparatus as claimed in claim 11, characterized in that said ramp-altering means comprises a second operational amplifier having a gain/bandwidth characteristic similar to that of said comparison means, and
said second operational amplifier has a first input coupled to a signal path between the output of the comparison means and said control voltage input, and an output coupled to one of said inputs of said comparison means.

* * * * *